United States Patent [19]

Tehrani et al.

[11] Patent Number: 5,703,805
[45] Date of Patent: Dec. 30, 1997

[54] METHOD FOR DETECTING INFORMATION STORED IN A MRAM CELL HAVING TWO MAGNETIC LAYERS IN DIFFERENT THICKNESSES

[75] Inventors: Saied N. Tehrani, Tempe; Eugene Chen, Gilbert; Mark Durlam; Xiaodong T. Zhu, both of Chandler, all of Ariz.

[73] Assignee: Motorola, Schaumburg, Ill.

[21] Appl. No.: 646,897

[22] Filed: May 8, 1996

[51] Int. Cl.$^6$ .............................................. G11C 11/15
[52] U.S. Cl. ........................ 365/173; 365/171; 365/158
[58] Field of Search ............................ 365/171, 173, 365/158

[56] References Cited

U.S. PATENT DOCUMENTS

| | | | |
|---|---|---|---|
| 3,913,080 | 10/1975 | Leo et al. | 365/168 |
| 5,173,873 | 12/1992 | Wu et al. | 365/158 |
| 5,343,422 | 8/1994 | Kung et al. | 365/173 |
| 5,375,082 | 12/1994 | Katti et al. | 365/158 |
| 5,420,819 | 5/1995 | Pohm | 365/173 |
| 5,477,482 | 12/1995 | Prinz | 365/173 |

*Primary Examiner*—David C. Nelms
*Assistant Examiner*—Michael T. Tran
*Attorney, Agent, or Firm*—Eugene A. Parsons

[57] ABSTRACT

A method for detecting and storing four states contained in a MRAM cell having two layers (11,13) which have different thicknesses is provided. A first magnetic field is applied to the MRAM cell, which causes a magnetoresistive change in the MRAM cell. A first and second states are detected based on the magnetoresistive change. A second magnetic field is further applied to the MRAM cell. A third and fourth states are detected based on the magnetoresistive change due to the second magnetic field.

25 Claims, 5 Drawing Sheets

METHOD FOR DETECTING INFORMATION STORED IN A MRAM CELL HAVING TWO MAGNETIC LAYERS IN DIFFERENT THICKNESSES

FIELD OF THE INVENTION

The present invention relates to a method for detecting states contained in a magnetic random access memory cell, and more particularly, to a method for detecting four states in one magnetic random access memory cell having two layers of magnetic material separated by a conductor layer and each layer having a different switching threshold.

BACKGROUND OF THE INVENTION

A magnetic random access memory (MRAM) using the giant magnetoresistive (GMR) effect has been developing at present. As an example, a traditional MRAM is formed by a plurality of cells, each cell having two magnetic layers separated by a spacer layer. The cell may contain one bit of information, that is logical "0" or "1" state. In order to detect which of the states contained in the cell, a magnetic field of certain magnitude is first applied to the cell. Then a magnetic field of the same magnitude but the opposite polarity is applied, a resulting change of the cell resistance is detected from voltage changes on the sense line. When the voltage increases, for example, the cell contains a logical "0" state, and when the voltage decreases the cell contains a logical "1" state. These states are contained in connection with the direction of magnetization in one of the two magnetic layers.

As mentioned above, a traditional MRAM contains one bit of information per cell. However, future applications demand memory architecture with higher density and faster access time.

Accordingly, it is desirable to utilize a method to detect and store information in each layer of the cell to increase memory density and at the same time to improve the read and write access time.

SUMMMARY OF THE INVENTION

A method is desired for detecting one of a first state, a second state, a third state and a fourth state stored in the MRAM cell including the steps of applying a first magnetic field to the MRAM cell, sensing one of the first state and the second state in the MRAM cell in response to a change of a magnetoresistance due to the first magnetic field, applying a second different magnetic field to the MRAM cell, and sensing one of the third state and the fourth state in the MRAM cell in response to a change of a magnetoresistance due to the second magnetic field.

DESCRIPTION OF THE PREFERRED EMBODIMENTS

Figure 1:
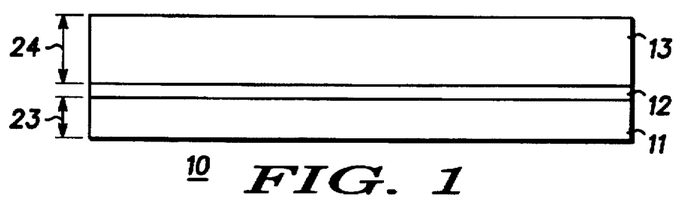
FIG. 1 illustrates an enlarged cross-sectional view of a schematic MBAM cell to which the present invention is used.

FIG. 1 illustrates an enlarged cross-sectional view of a MRAM cell 10 using a giant magnetoresistive (GMR) cell having two layers that are ferromagnetically coupled. MRAM cell 10 includes a plurality of magnetic layers including a first magnetic layer 11 and a second magnetic layer 13. Layers 11 and 13 are separated by a first conductive spacer layer 12. Magnetic layers 11 and 13 each can be single layers of magnetic materials such as a layer of nickel or iron or cobalt or alloys thereof including alloys having palladium or platinum. Any of layers 11 and 13 alternately can be a composite magnetic layer, such as a layer of nickel-iron-cobalt covering a layer of cobalt-iron or three layer structures including layers of cobalt-iron and nickel-iron-cobalt and cobalt-iron with cobalt-iron at the interface with adjacent layers. Materials that are suitable for layer 12 include most conductive materials including copper, copper alloys, chromium, and chromium alloys. For proper operation, layers 11 and 13 each have a different magnetic switching threshold. That is, they each switch states upon the application of different magnitudes of magnetic fields. In the preferred embodiment, layer 11 has a first thickness or thickness 23 which is typically approximately 40 angstrom and layer 13 has a second thickness or thickness 24, which is typically approximately 60 angstrom that is greater than thickness 23. The different thicknesses are explained hereinafter in the discussion of FIGS. 2 and 3.

Figure 2:
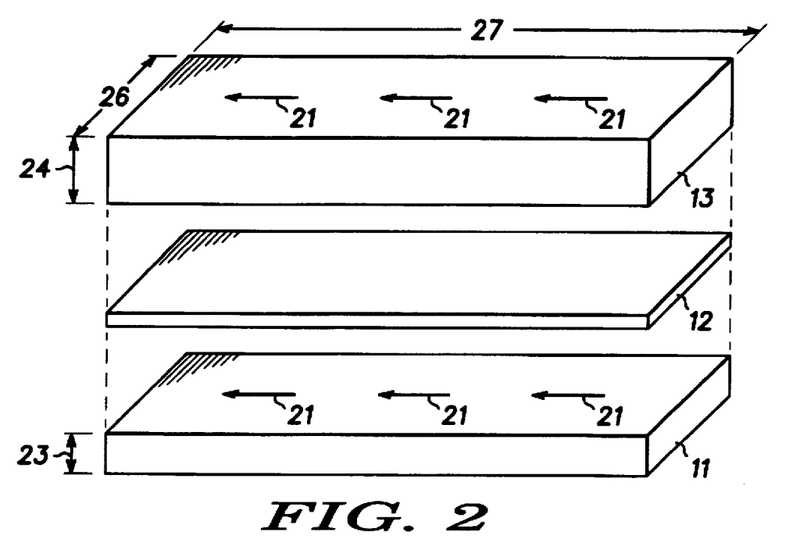
FIG. 2 illustrates an enlarged exploded view of the schematic MRAM cell shown in FIG. 1 for explaining a working of the MRAM cell.
Figure 3:
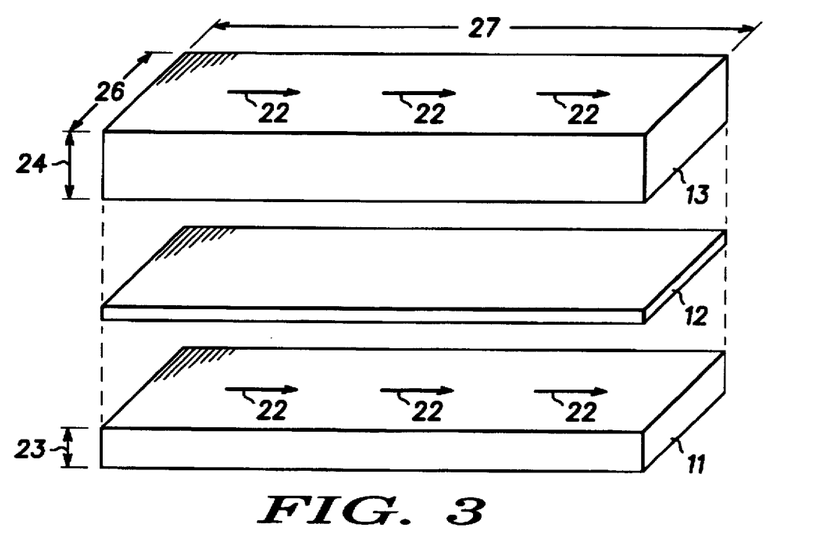
FIG. 3 illustrates another enlarged exploded view of the schematic MRAM cell shown in FIG. 1 for explaining a working of the MRAM cell.

FIG. 2 and FIG. 3 illustrate enlarged exploded views of MRAM cell 10 shown in FIG. 1. Portions of FIG. 2 and FIG. 3 that have the same reference numbers as FIG. 1 are the same as the corresponding FIG. 1 elements. In the preferred embodiment, layers 11 and 13 are rectangular and are formed with the easy axis of magnetization along a length 27 and not along a width 26. In other embodiments, the easy axis can be along width 26. Layers 11 and 13 each have magnetization vectors 21 (FIG. 2) and 22 (FIG. 3) that are along length 27, that is, parallel to length 27. It should be noted that, while the vectors 21 and 22 are described as "along length 27" and "parallel to length 27", minor variations can occur so that these terms are not intended to mean exact relationships but only general directions (i.e. substantially). Layers 11 and 13 are coupled by a ferromagnetic coupling which allows vectors 21 and 22 to align in the same direction in the absence of an external magnetic field. This coupling is a function of the material and the thickness of layer 12.

Additionally width 26 is formed to be smaller than the width of the magnetic domain walls or transition width within layers 11 and 13. Consequently, vectors 21 and 22 can not be parallel to width 26. Typically, widths of less than 1.0 micron result in such a constraint. In the preferred embodiment, width 26 is less than one micron and is as small as can be made by manufacturing technology, and length 27 is approximately five times width 26. The greater the value of length 27 the higher the output voltage of MRAM cell 10. Also in the preferred embodiment, thickness 23 is approximately two to six nanometers and thickness 24 is approximately three to ten nanometers. As will be seen hereinafter, the difference in thicknesses 23 and 24 affect the switching points of layers 11 and 13. In the preferred embodiment, layers 11 and 13 each are of two layer structures including layers of cobalt-iron and nickel-iron-cobalt so that cobalt-iron is at the interface with conductive layer 12.

Because thickness 24 is greater than thickness 23, MRAM cell 10 has a magnetoresistive characteristic curve that has a side operating area. The resistance can be determined by sensing a voltage output of MRAM cell 10. The voltage output is the voltage drop across the length of MRAM cell 10 with a constant current applied along the length of MRAM cell 10 and while a magnetic field is applied. One method of determining the state of MRAM cell 10 is to apply a magnetic field. When the total magnetic field is in a direction that supports the magnetic vectors, that is, in the same direction along length 27 as the magnetization vectors, the magnetic vectors do not rotate so the resistance of MRAM cell 10 does not change. Correspondingly, the output voltage also does not change. It should be noted that, while it has been stated that "the magnetic vectors do not rotate so the resistance of MRAM cell 10 does not change" and "the output voltage also does not change" some minor variations may occur as a natural phenomenon and this is meant only as a general statement of operation.

However, when the total magnetic field opposes the vectors, the magnetic vectors rotate. As the field increases the vectors of layer 11 begin to rotate toward the opposite end of layer 11 (the vectors of layer 13 may rotate slightly). As the field increases further, the vectors of layer 11 continue to rotate and the resistance increases until the vectors snap to the opposite direction. For further increases, the resistance remains constant until the vectors of layer 13 also snap. Thereafter, the resistance decreases as the field increases.

Figure 4:
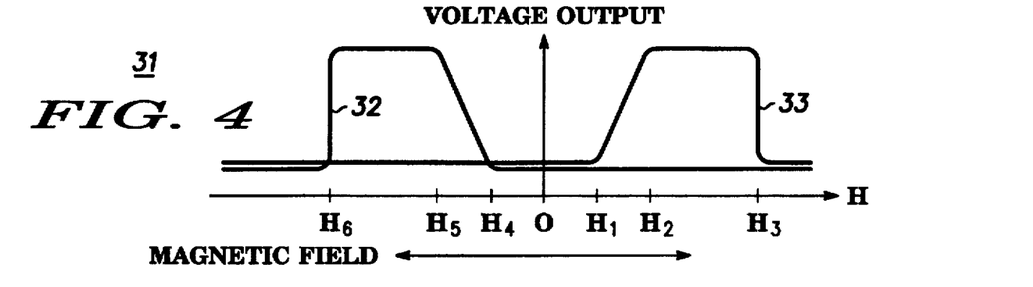
FIG. 4 is a graph illustrating characteristics of the MRAM cell shown in FIG. 1.

FIG. 4 is a graph 31 illustrating the resistance or voltage output of MRAM cell 10 (FIG. 1) verses the applied magnetic field or total magnetic field. The abscissa indicates magnetic field direction and strength, that is, the strength either supports or opposes the magnetic vectors of MRAM cell 10. The ordinate represents the voltage output of MRAM cell 10. A curve 32 indicates the magnetoresistance characteristic, via the output voltage, for various magnetic field intensities for one direction of magnetization vectors. A curve 33 indicates the magnetoresistance characteristic, via the output voltage, for the same magnetic field intensities for the opposite direction of magnetization vectors. To the right of zero, curves 32 and 33 indicate the output voltage for magnetic fields that support the vectors of curve 32 and oppose the vectors of curve 33, and magnetic fields to the left of zero support the vectors of curve 33 and oppose the vectors of curve 32. Typically, curves 32 and 33 cross the voltage axis at the same point and have the same minimum values. For the sake of explanation, curve 33 is shifted vertically a slight amount to show the differences between the curves.

At zero applied field, the voltage output of MRAM cell 10 is approximately the same regardless of the magnetization vector direction. As the field increases from zero to $H_1$, curve 33 shows the voltage output of MRAM cell 10 having vectors that are opposed by the total magnetic field, and curve 32 shows the voltage of MRAM cell 10 having vectors that are supported by the magnetic field. At magnetic field intensity of $H_1$, the vectors of the layer 11 begin to rotate and increase the output voltage. As the total magnetic field intensity increases between $H_1$ and $H_2$, the magnetic vectors of layer 11 continue to rotate and snap to the other direction near a field intensity of $H_2$. Near $H_3$, the vectors of thicker layer 13 snap to the opposite direction and the resistance decreases for values of $H_3$ and above. Similarly, the output voltage for an opposite direction total magnetic field is shown between zero and $H_4$ to $H_6$.

Because layers 11 and 13 (FIG. 1) have different thicknesses, the magnetic vectors rotate at different intensities of the total magnetic field. This characteristic results in curves 32 and 33 having a wide operating range. That is, the applied magnetic field can vary from $H_2$ to $H_3$ or from $H_5$ to $H_6$ without a change in the output voltage. This allows the total magnetic field to vary or drift and relaxes the need to have stringent controls on the magnetic field intensity thereby reducing the circuitry needed to control the magnetic field and reducing the costs of memories and other apparatus using MRAM cell 10.

As can be seen in FIG. 4, MRAM cell 10 having two layers, both layers 11 and 13 having different thicknesses, shows two operating curves in positive and negative magnetic fields. Therefore, MRAM cell 10 can contain and provide four states corresponding to the direction of magnetic vectors in both layers 11 and 13, that is two-bit information represented by logic "00", "01", "10", and "11". FIGS. 5-8 show the response characteristics for each logic when a magnetic field is applied from a zero magnetic field to a positive field and from a zero magnetic field to a negative field. The abscissa and the ordinate represent the same one in FIG. 4.

Figure 5:
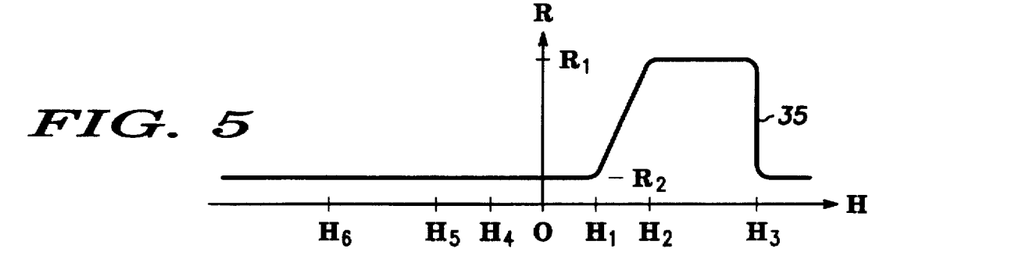
FIG. 5 is a graph illustrating the response characteristics of the MRAM cell storing a logic "00" state from zero magnetic field to positive field and from zero magnetic field to negative field.

FIG. 5 is a graph 35 illustrating the response characteristics of MRAM cell 10 containing a logic "00". It is assumed that the direction of magnetic vectors in layers 11 and 13 in FIG. 2 represent a logic "00". As the magnetic field increases from $H_1$ to $H_2$ toward a positive direction, the magnetic vectors in thin layer 11 begin to rotate and snap at $H_2$ to the same direction as the applied magnetic field. The resistance increases until the vectors snap. As the magnetic field further strengthens from $H_2$ to $H_3$, the magnetic vectors in thick layer 13 continue to rotate and snap at $H_3$ to the same direction as the applied magnetic field, which causes the resistance of MRAM cell 10 to sharply decrease.

When the magnetic field is applied in a negative direction to MRAM cell 10, the magnetic vectors keep the same direction as the applied magnetic field. The resistance also holds at a low level because both the magnetic field and the magnetic vectors point in the same direction.

Figure 6:
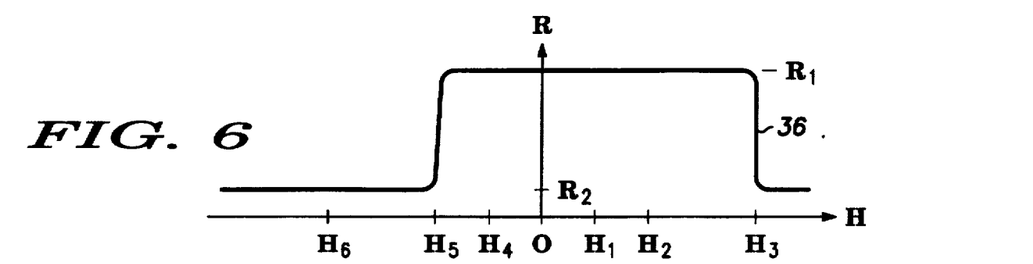
FIG. 6 is a graph illustrating the response characteristics of the MRAM cell storing a logic "01" state from zero magnetic field to positive field and from zero magnetic field to negative field.

FIG. 6 is a graph 36 illustrating the response characteristics of MRAM cell 10 containing a logic "01", wherein magnetic vectors in thin layer 11 and thick layer 13 point in a positive direction and a negative direction, respectively. Even when the positive magnetic field is applied to MRAM cell 10 from $H_1$ to $H_2$, the resistance remains at a high level because the magnetic vectors in thin layer 11 point in the same direction as the applied magnetic field. When the magnetic field applied to MRAM cell 10 is further increased, the magnetic vectors in thick layer 13 are switched at $H_3$ to the same direction as the applied magnetic field, which causes the resistance of MRAM cell 10 to sharply decrease.

As the negative magnetic field increases from $H_4$ to $H_5$, the magnetic vectors in layer 11 begin to rotate and snap at $H_5$ to the same direction as the applied magnetic field. The resistance decreases until the magnetic vectors snap and keep a low level at the stronger magnetic field because the magnetic vectors in both layers now point in the same direction.

Figure 7:
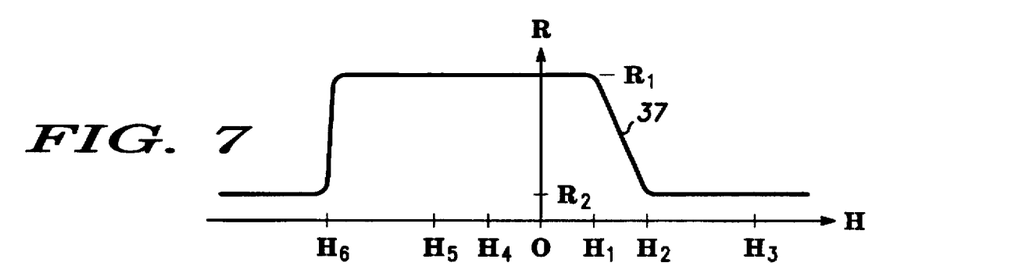
FIG. 7 is a graph illustrating the response characteristics of the MRAM cell storing a logic "10" state from zero magnetic field to positive field and from zero magnetic field to negative field.

FIG. 7 is a graph 37 illustrating the response characteristics of MRAM cell 10 containing a logic "10", wherein magnetic vectors in thin layer 11 and thick layer 13 point in a negative direction and a positive direction, respectively. As the positive magnetic field increases from $H_1$ to $H_2$, the magnetic vectors in layer 11 begin to rotate and snap at $H_2$ to the same direction as the applied magnetic field. The resistance decreases until the magnetic vectors snap and keeps a low level at the stronger magnetic field because the magnetic vectors in both layers now point in the same direction.

When the negative magnetic field is applied to MRAM cell 10 from $H_4$ to $H_5$, the resistance remains at a high level because the magnetic vectors in thin layer 11 point in the same direction as the applied magnetic field. When the magnetic field applied to MRAM cell 10 is further increased, the magnetic vectors in thick layer 13 are switched at $H_6$ to the same direction as the applied magnetic field, of which causes the resistance of MRAM cell 10 to sharply decrease.

Figure 8:
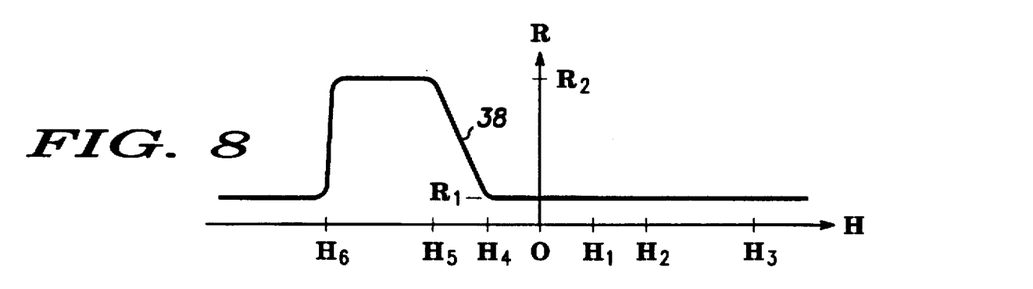
FIG. 8 is a graph illustrating the response characteristics of the MRAM cell storing a logic "11" state from zero magnetic field to positive field and from zero magnetic field to negative field.

FIG. 8 is a graph 38 illustrating the response characteristics of MRAM cell 10 containing a logic "11". The direction of magnetic vectors in both layers 11 and 13 are the same as in FIG. 3. When the magnetic field is applied in a positive direction to MRAM cell 10, the magnetic vectors keep the same direction as the applied magnetic field. The resistance also holds at a low level because both the magnetic field and the magnetic vectors point in the same direction.

As the magnetic field increases from $H_4$ to $H_5$ in a negative direction, the magnetic vectors in layer 11 begin to rotate and snap at $H_5$ to the same direction as the applied magnetic field. The resistance increases until the vectors snap. As the magnetic field further strengthens from $H_5$ to $H_6$, the magnetic vectors in layer 13 continue to rotate and snap at $H_6$ to the same direction as the applied magnetic field, which causes the resistance of MRAM cell 10 to sharply decrease.

The response characteristic shown in FIGS. 5-8 depends on the four states contained in MRAM cell 10. Therefore, the change of the sensed magnetic resistance makes it possible to detect the four states contained in MRAM cell 10.

Figure 9:
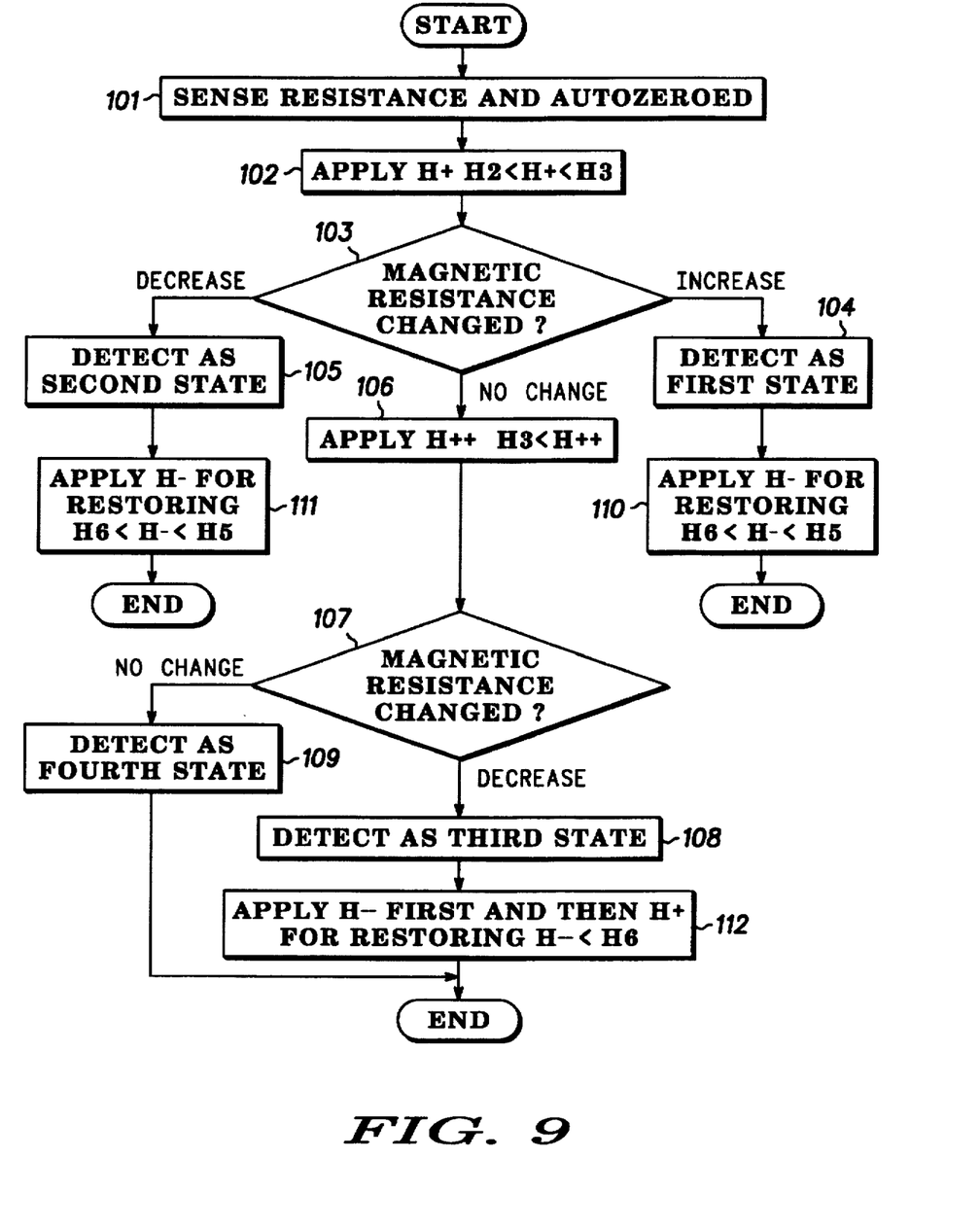
FIG. 9 illustrates a flowchart of one method for detecting states contained in the MRAM cell.

FIG. 9 illustrates a flowchart of one method for detecting four states contained in MRAM cell 10. In the beginning, no word current is applied and a sense current is applied to sense a resistance, and then circuit is autozeroed (block 101). Subsequently, a first magnetic field H+ between $H_2$ and $H_3$, which is generated by the combination of a sense current in a sense line (not shown) and a word current in a word line (not shown), is applied to MRAM cell 10 (block 102), and the change of the resistance due to applying the first magnetic field is sensed (block 103). When the resistance increases compared to the resistance prior to applying the first magnetic field as shown in FIG. 5, MRAM cell 10 contains a first state (block 104), that is a logic "00". When the resistance decreases as shown in FIG. 7, MRAM cell 10 contains a second state (block 105), that is a logic "10". When the resistance keeps the same level, as shown in FIGS. 6 and 8, the process goes to block 106. At block 106, a second magnetic field H++ which is over $H_3$, is applied to MRAM cell 10. The change of the resistance due to applying the second magnetic field is sensed (block 107). When the magnetic resistance decreases as shown in FIG. 6, MRAM cell 10 contains a third state (block 108), that is a logic "01". When the magnetic resistance keeps the same level as shown FIG. 8, MRAM cell 10 contains a fourth state (block 109), that is a logic "11".

When the first and second magnetic fields are applied to MRAM cell 10, the direction of magnetic vectors in the thin and/or thick layers 11 and 13 is completely switched to the opposite direction, which means information contained in MRAM cell 10 is destroyed. Therefore, a restoration process is needed, except for the fourth state.

When the first and second states are detected at blocks 104 and 105, magnetic vectors in thin layer 11 are switched to the opposite direction. Negative magnetic field H− between $H_6$ to $H_5$ is applied in order to switch the direction of magnetic vectors in thin layer 11 to the original direction (blocks 110, 111). When the third state is detected at block 108, magnetic vectors in thick layer 13 are switched to the opposite direction. Therefore, a magnetic field H−− lower than $H_6$ is applied followed by the magnetic field H+ between $H_2$ to $H_3$ in order to switch the direction of magnetic vectors in thick layer 13 to the original direction (block 112). This process, however, switches magnetic vectors in thin layer 11 to the same direction as that of thick layer 13. A magnetic field H+ between $H_2$ to $H_3$ is further applied to switch magnetic vectors in thin layer 11 to the original direction.

Figure 10:
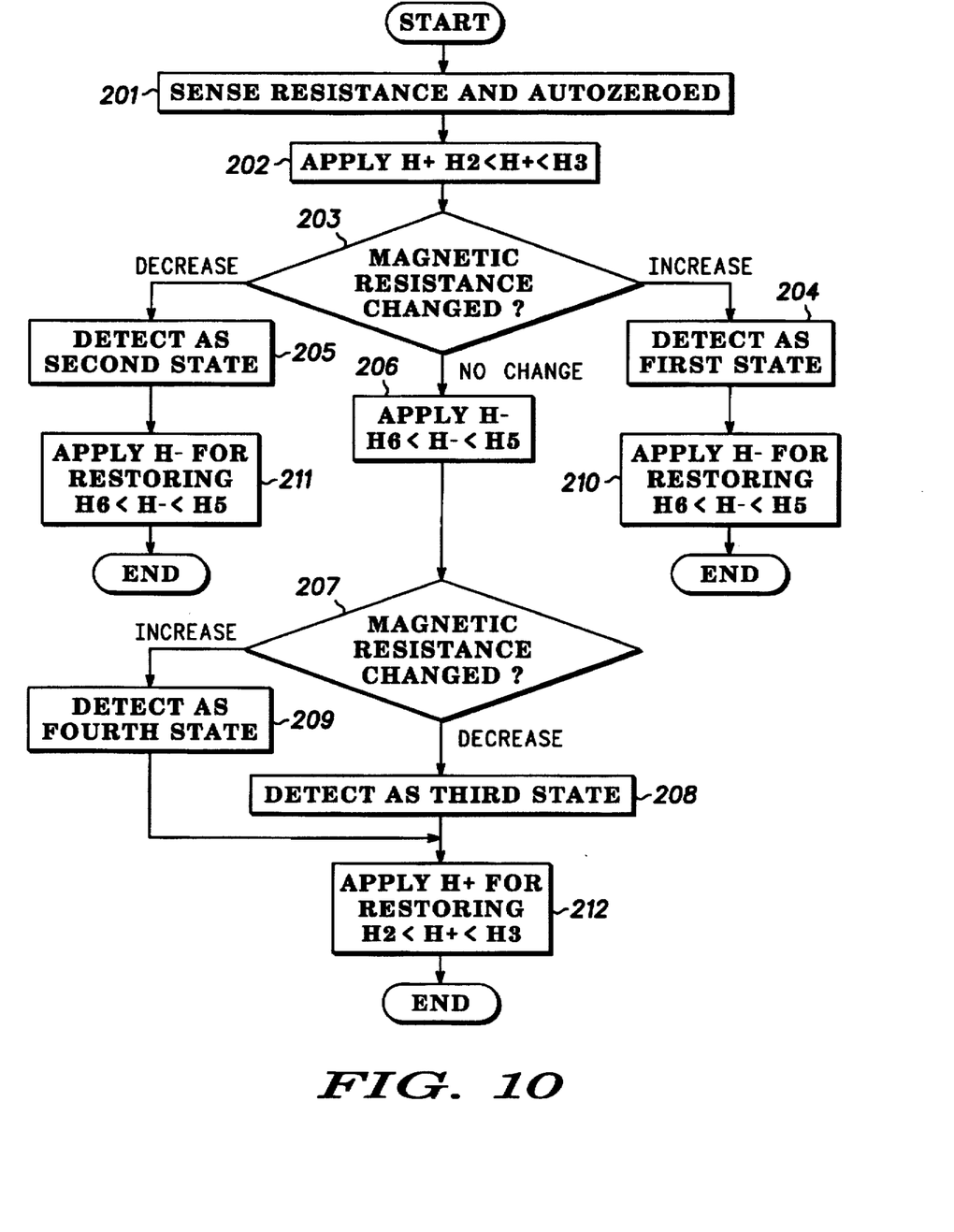
FIG. 10 illustrates a flowchart of another method for detecting states contained in the MRAM cell.

FIG. 10 illustrates a flowchart of another method for detecting four states contained in MRAM cell 10. This detecting method is different from the prior method in a second magnetic field and a restoring process. In the beginning, no word current is applied and a sense current is applied to sense a resistance, and then circuit is autozeroed (block 201). Subsequently, a first magnetic field H+ between $H_2$ and $H_3$ is applied to MRAM cell 10 (block 202). The change of the resistance due to applying the first magnetic field H+ is sensed (block 203). When the resistance increases compared to the resistance prior to applying the first magnetic field as shown in FIG. 5, MRAM cell 10 contains a first state (block 204), that is a logic "00". When the magnetic resistance decreases as shown in FIG. 7, MRAM cell 10 contains a second state (block 205), that is a logic "10". When the magnetic resistance keeps the same level as shown in FIGS. 6 and 8, the process goes to block 206. At block 206, a second magnetic field H− which is between $H_6$ to $H_5$, is applied to MRAM cell 10 (block 206). The change of the resistance due to applying the second magnetic field is sensed (block 207). When the resistance decreases as shown in FIG. 6, MRAM cell 10 contains a third state (block 208), that is a logic "01". When the resistance increases as shown FIG. 8, MRAM cell 10 contains a fourth state (block 209), that is a logic "11".

When the first and second states are detected at blocks 204 and 205, magnetic vectors in thin layer 11 are switched to the opposite direction. Therefore, a negative magnetic field H− between $H_6$ to $H_5$ is applied in order to switch the direction of magnetic vectors in thin layer 11 to the original direction (blocks 210, 211). When the third and fourth states are detected at blocks 208 and 209, magnetic vectors in thin layer 11 are switched to the opposite direction. Therefore, a magnetic field H+ between $H_2$ to $H_3$ is applied in order to switch the direction of magnetic vectors in thin layer 11 to the original direction (block 212).

Figure 11:
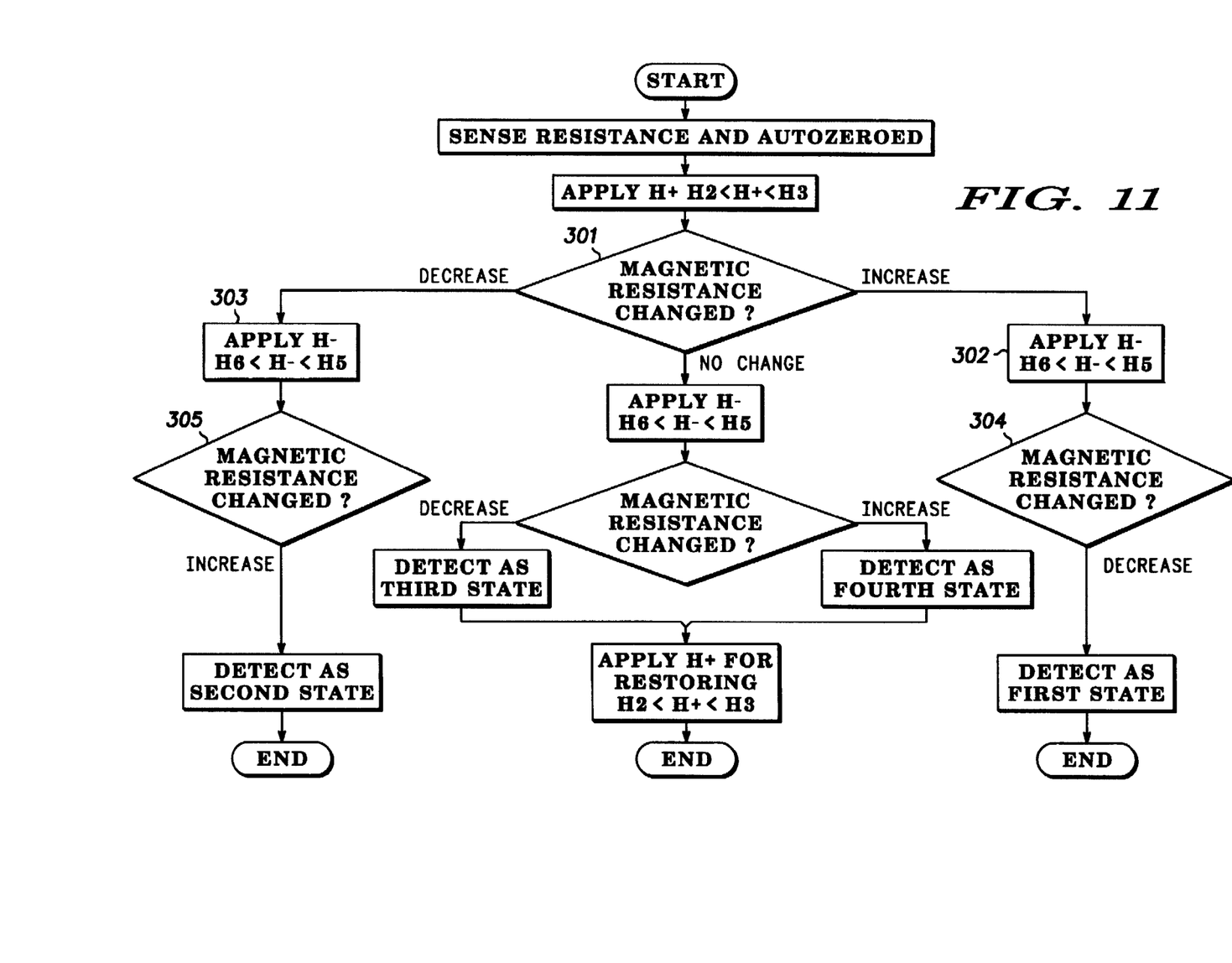
FIG. 11 illustrates a flowchart of still another method for detecting states contained in the MRAM cell.

FIG. 11 illustrates a flowchart of still another method for detecting four states contained in MRAM cell 10. Blocks of FIG. 11 that have the same reference numbers as FIG. 10 carry out the same operation as the corresponding FIG. 10 blocks. The process shown in FIG. 11 is the same as the process in FIG. 10 except that a magnetic field H– between $H_6$ to $H_5$ is applied at blocks 302 and 303 right after decision block 301 and no restoring process is carried out after decision blocks 304 and 05 because magnetic vectors in thin layer 11 are snapped to the initial direction at blocks 302 and 303.

A table illustrated below shows a method for storing four states in MRAM cell 10. A first and a second column in the Table represent the initial states and states to be stored in MRAM cell 10, respectively. A third and a fourth column represent a first magnetic field and a second magnetic field, to be applied to MRAM cell 10, respectively. Symbols "H+", "H++", "H–", and "H—" show a strength and a direction of a magnetic field applied to MRAM cell 10. H+ and H++ represent a positive magnetic field between $H_2$ to $H_3$, and over $H_3$, respectively. H– and H— represent a negative magnetic field between $H_6$ to $H_5$, and over $H_6$, respectively. Symbol "z,φ" represents that no further process is needed.

TABLE

Process for writing four states into the cell

| Initial states | States to be stored | First magnetic field | Second magnetic field |
|---|---|---|---|
| 00 | 00 | H— | — |
| 01 |  |  |  |
| 10 |  |  |  |
| 11 |  |  |  |
| 00 | 01 | H— | H+ |
| 01 |  |  |  |
| 10 |  |  |  |
| 11 |  |  |  |
| 00 | 10 | H++ | H– |
| 01 |  |  |  |
| 10 |  |  |  |
| 11 |  |  |  |
| 00 | 11 | H++ | — |
| 01 |  |  |  |
| 10 |  |  |  |
| 11 |  |  |  |

In the Table, when a state "00" is required to be stored, a magnetic field H— is applied. When a state "01" is required to be stored, a first magnetic field H— is applied first to MRAM cell 10 regardless of the initial states. Then a second magnetic field H+ is applied because the magnetic field H— causes magnetic vectors in both thin and thick layers 11 and 13 to switch. When a state "10" is required to be stored, a first magnetic field H++ is applied first to MRAM cell 10 regardless of the initial states. Then a second magmagnetic field H– is applied. When a state "11" is required to be stored, a first magnetic field H++ is applied.

By now it should be appreciated that there has been provided a novel method of detecting and writing the states in MRAM cell 10. MRAM cell 10 having two layers of different thicknesses may contain two bits of information, each layer having a bit. This novel method may detect and store two bits in MRAM cell 10 at the same time so that detecting and storing cycle times are reduced and the density of the MRAM increases.

We claim:

1. In a magnetic random access memory (MRAM) cell having two switchable magnetic layers having different magnetic switching thresholds separated by a conductor layer, a method for detecting one of a first state, a second state, a third state and a fourth state stored in the MRAM cell comprising the steps of:

applying a first magnetic field to the MRAM cell;

sensing one of the first state and the second state in the MRAM cell in response to a change of a resistance due to the first magnetic field;

applying a second different magnetic field to the MRAM cell; and sensing one of the third state and the fourth state in the MRAM cell in response to a change of a resistance due to the second magnetic field.

2. The method of claim 1 further including restoring an original state in the MRAM cell where the resistance has changed.

3. The method of claim 2 wherein the original state is restored by applying a magnetic field opposite to the first magnetic field in a direction and having the same strength as the first magnetic field when the first or second state is sensed, and the original state is restored the second different magnetic field and then by applying a magnetic field opposite to the second magnetic field in a direction and having the same strength as the first magnetic field when the third or fourth state is sensed.

4. The method of claim 1 wherein the first magnetic field has a strength which causes a magnetization vector in only one of the two magnetic layers to switch, and the second magnetic field causes a magnetization vector in both of the two magnetic layers to switch.

5. The method of claim 4 wherein the first magnetic field causes the magnetization vector in a thinner magnetic layer to switch.

6. The method of claim 1 wherein the first state is sensed when the resistance in the MRAM cell increases in response to the first magnetic field, the second state is sensed when the resistance in the MRAM cell decreases in response to the first magnetic field, the third state is sensed when the resistance in the MRAM cell increases in response to the second magnetic field, and the fourth state is sensed when the resistance in the MRAM cell does not change.

7. The method of claim 6 wherein the first, second, third, and fourth states represent two bits of 00, 10, 01, and 11, respectively.

8. The method of claim 1 further including applying a third magnetic field to the cell according to a difference between a state sensed and a state to be stored.

9. The method of claim 8 further including applying a fourth magnetic field to the MRAM cell.

10. The method of claim 8 wherein the third magnetic field causes a magnetization vector in either of the two magnetic layers to switch.

11. The method of claim 9 wherein the third magnetic field causes a magnetization vector in both of the two magnetic layers to switch, and the fourth magnetic field causes a magnetization vector in either of the two magnetic layers to switch.

12. The method of claim 8 wherein the third magnetic field causes a magnetization vector in both of the two magnetic layers to switch.

13. In a magnetic random access memory (MRAM) cell having two magnetic layers having different thicknesses separated by a conductor layer, a method for detecting one of a first state, a second state, a third state and a fourth state stored in the MRAM cell comprising the steps of:

applying a first magnetic field to the MRAM cell;

sensing one of the first state and the second state in the MRAM cell in response to a change of a resistance due to the first magnetic field;

applying a second different magnetic field to the MRAM cell which is opposite to the first magnetic field in a direction and having the same strength as the first magnetic field; and sensing one of the third state and the fourth state in the MRAM cell in response to a change of a resistance due to the second magnetic field.

14. The method of claim 13 further including restoring an original state in the MRAM cell where the resistance has changed.

15. The method of claim 14 wherein the original state is restored by applying a magnetic field opposite to the first magnetic field in a direction and having the same strength as the first magnetic field when the first or second state is sensed, and the original state is restored by applying the first magnetic field when the third or fourth state is sensed.

16. The method of claim 13 wherein the first and second magnetic fields have a strength which causes a magnetization vector in only one of the two magnetic layers to switch.

17. The method of claim 16 wherein the first and second magnetic field cause the magnetization vector in a thinner magnetic layer to switch.

18. The method of claim 13 wherein the first state is sensed when the resistance in the MRAM cell increases in response to the first magnetic field, and the second state is sensed when the resistance in the MRAM cell decreases in response to the first magnetic field, the third state is sensed when the resistance in the MRAM cell decreases in response to the second magnetic field, and the fourth state is sensed when the resistance in the MRAM cell increases in response to the second magnetic field.

19. The method of claim 18 wherein the first, second, third, and fourth state represent two bits of 00, 10, 01, and 11 respectively.

20. The method of claim 13 further including applying a third magnetic field to the cell according to a difference between state sensed and state to be stored.

21. The method of claim 20 further including applying a fourth magnetic field to the MRAM cell.

22. The method of claim 20 wherein the third magnetic field causes a magnetization vector in either of the two magnetic layers to switch.

23. The method of claim 21 wherein the third magnetic field causes a magnetization vector in both of the two magnetic layers to switch, and the fourth magnetic field causes a magnetization vector in either of the two magnetic layers to switch.

24. The method of claim 20 wherein the third magnetic field causes a magnetization vector in both of the two magnetic layers to switch.

25. In a magnetic random access memory (MRAM) cell having two magnetic layers having different thicknesses separated by a conductor layer, a method for storing one of a first state, a second state, a third state and a fourth state in the MRAM cell comprising the steps of:

switching magnetic vectors in both layers by applying a first magnetic field to the cell when the first state and the fourth state are stored in the cell; and switching magnetic vectors in both layers by applying the first magnetic field to the cell and then applying a second magnetic field to the cell when the second and third states are stored in the cell.

* * * * *